United States Patent [19]

Belenky et al.

[11] Patent Number: 5,448,585
[45] Date of Patent: Sep. 5, 1995

[54] ARTICLE COMPRISING A QUANTUM WELL LASER

[75] Inventors: Grigory Belenky, Scotch Plains; Rudolf F. Kazarinov, Martinsville, both of N.J.

[73] Assignee: AT&T IPM Corp., Coral Gables, Fla.

[21] Appl. No.: 267,727

[22] Filed: Jun. 29, 1994

[51] Int. Cl.$^6$ ............................................. H01S 3/19
[52] U.S. Cl. ................................................ 372/45
[58] Field of Search ................................ 372/45, 46

[56] References Cited

U.S. PATENT DOCUMENTS 5,331,655   7/1994   Harder et al. ............................ 372/45

OTHER PUBLICATIONS

"High-performance Uncooled 1.3-$\mu$m $Al_xGa_yIn_{1-x-y}As$/InP Strained-Layer Quantum-well Lasers for Fiber-in-the-loop Applications", by C. E. Zah et al., OFC 94 Technical Digest, vol. 4, p. 204. (No month).
"1.3 $\mu$ Decoupled Confinement Heterostructure Lasers Grown by Chemical Beam Epitaxy", by S. Hausser et al., Applied Physics Letters, vol. 62(7), p. 663., Feb. 15, 1993.

Primary Examiner—James W. Davie
Attorney, Agent, or Firm—Eugen E. Pacher

[57] ABSTRACT

The quantum well lasers according to the invention comprise an electron stopper layer that provides a barrier for the flow of electrons from the active region to the p-side waveguide and cladding layers and in preferred embodiments also comprise a hole stopper layer that provides a barrier for the flow of holes from the active region to the n-side waveguide and cladding layers. An exemplary InP-based laser according to the invention comprises AlInGaAs quantum well layers and barrier layers, and an AlInAs electron stopper layer and an InP hole stopper layer. Lasers according to the invention can have relatively low temperature dependence of, e.g., threshold current and/or external quantum efficiency, and may be advantageously incorporated in, e.g., optical fiber communication systems.

11 Claims, 4 Drawing Sheets

ARTICLE COMPRISING A QUANTUM WELL LASER

FIELD OF THE INVENTION

This invention pertains to quantum well lasers, and articles that comprise such lasers.

BACKGROUND OF THE INVENTION

GaAs-based as well as InP-based quantum well lasers are known. Such lasers typically comprise an active region that contains one or more quantum wells, the active region sandwiched between two waveguide layers, the combination in turn sandwiched between two cladding layers. Adjacent quantum wells are separated by a barrier layer.

Although quantum well lasers are widely used, prior art quantum well lasers (especially InP-based quantum well lasers) have shortcomings. For instance, in order to overcome problems (e.g, a small conduction band discontinuity between InP and the active region material, as well as a low potential barrier for electrons between the active and cladding regions) inherent in the commonly used InGaAsP/InP material system, it has been found necessary to use relatively highly doped cladding layers. This results in relatively high absorption of the lasing mode, necessitating use of a multi quantum well (MQW) active region. Furthermore, due to the noted and other characteristic of InGaAsP/InP quantum well lasers, such lasers typically exhibit undesirably strong temperature dependence of threshold current and external quantum efficiency. The referred-to strong temperature dependences are particularly detrimental for uncooled lasers which typically have to be operable over a rather large temperature range, e.g., −40 to +85° C. for some uncooled optical communication lasers.

C. E. Zah et al., OFC 94 Technical Digest, Vol. 4, p. 204 disclosed an InP-based strained MQW laser with improved temperature performance. The improvement resulted from the substitution of AlInGaAs for the conventionally used InGaAsP, with attendant increased electron confinement energy. The characteristic temperature ($T_o$) of the threshold current of the laser was reported to be 80K.

S. Hausser et al., Applied Physics Letters, Vol. 62(7), p. 663 disclosed a InGaAsP/InP MQW laser that comprised an InP hole barrier layer between the MQW region and the n-side cladding layer. The barrier served to prevent hole leakage into the n-side cladding region, and was said to result in improved temperature performance of the laser. To was reported to be 62K. The authors report also fabrication of a laser "... that has an InP electron barrier but no hole barrier adjacent to the quantum wells...", and concluded that the (InP) hole barrier is very important but that the (InP) electron barrier "... has only a minor effect and is not really necessary...".

In view of the potential importance of reduced temperature dependence of laser characteristics, especially for uncooled lasers, it would be highly desirable to have available a laser that can have relatively low temperature dependence of, e.g., threshold current and external quantum efficiency. This application discloses such a laser.

SUMMARY OF THE INVENTION

In a broad aspect the invention is embodied in an article that comprises a quantum well semiconductor laser having features that can result in improved laser characteristics.

More specifically, the laser comprises a multilayer semiconductor structure on a substrate, and contacts that facilitate flowing a current through the multilayer structure. The multilayer structure comprises a (optionally n-doped) n-side waveguide layer, an active region comprising at least one quantum well, and a (optionally p-doped) p-side waveguide layer, with the active region disposed between said two waveguide layers.

The n-side waveguide layer is disposed between the active region and an n-doped cladding layer, and the p-side waveguide layer is disposed between the active region and a p-doped cladding layer. In preferred embodiments the multilayer structure further comprises a hole stopper layer disposed between the at least one quantum well and the n-side waveguide layer, the hole stopper layer selected to provide a barrier for the flow of holes from the active region to the n-side waveguide layer.

Significantly, the multilayer structure further comprises an electron stopper layer disposed between the at least one quantum well and the p-side waveguide layer, the electron stopper layer selected to provide a barrier for the flow of electrons from the active region to the p-side waveguide layer. The electron stopper layer material is selected to have bandgap energy $E_g$ at least as large as the bandgap energy of InP, with more than 50% of the offset associated with the discontinuity of the conduction band. The bandgap energy of InP is about 1.35 eV. If a hole stopper layer is provided then the electron stopper layer will have a chemical composition that differs from the chemical composition of the hole stopper layer. Material of the hole stopper layer typically has an electron affinity that is greater than that of the material of the electron stopper layer. In a preferred embodiment the laser is InP-based, with the active region comprising AlInGaAs, and the laser having a characteristic temperature ($T_o$) of the threshold current greater than 80K.

The terminology "selected to provide a barrier to the flow of electrons/holes" does not imply complete stoppage of the flow of electrons/holes. Instead, the terminology is to be understood to mean that the presence of the given stopper layer results in at least substantially lower flow, at a device operating temperature, of the relevant charge carrier from the active region to the relevant waveguide layer, as compared to the flow observed in an otherwise identical comparison device that does not comprise the given stopper layer.

Each of the hole stopper layer and electron stopper layer provides a potential barrier to the flow of holes and electrons, respectively, from the active region to the n-side and p-side waveguide and cladding regions, respectively, with the "height" of the potential barrier typically being at least about 50 meV (corresponding approximately to 2kT at T=300 K, where k is Boltzmann's constant). Clearly, a stopper layer has to have sufficient thickness (exemplarily 10 nm) such that the carrier tunneling probability through the stopper layer is insignificant (e.g., <1%).

The layer structure of a laser according to the invention can be formed on either a p-doped or an n-doped substrate, the substrate can be any appropriate semiconductor material (typically InP or GaAs), and the layer structure can be formed by any appropriate technique, e.g., MOCVD, MBE, CVD, CBE, or MOMBE. Furthermore, lasers according to the invention comprise lateral confinement means, e.g., a mesa structure or a buried heterostructure. Such means are well known in the art and do not require further exposition. All lateral current and/or optical mode confinement means are contemplated.

DETAILED DESCRIPTION OF SOME PREFERRED EMBODIMENTS

Figure 1:
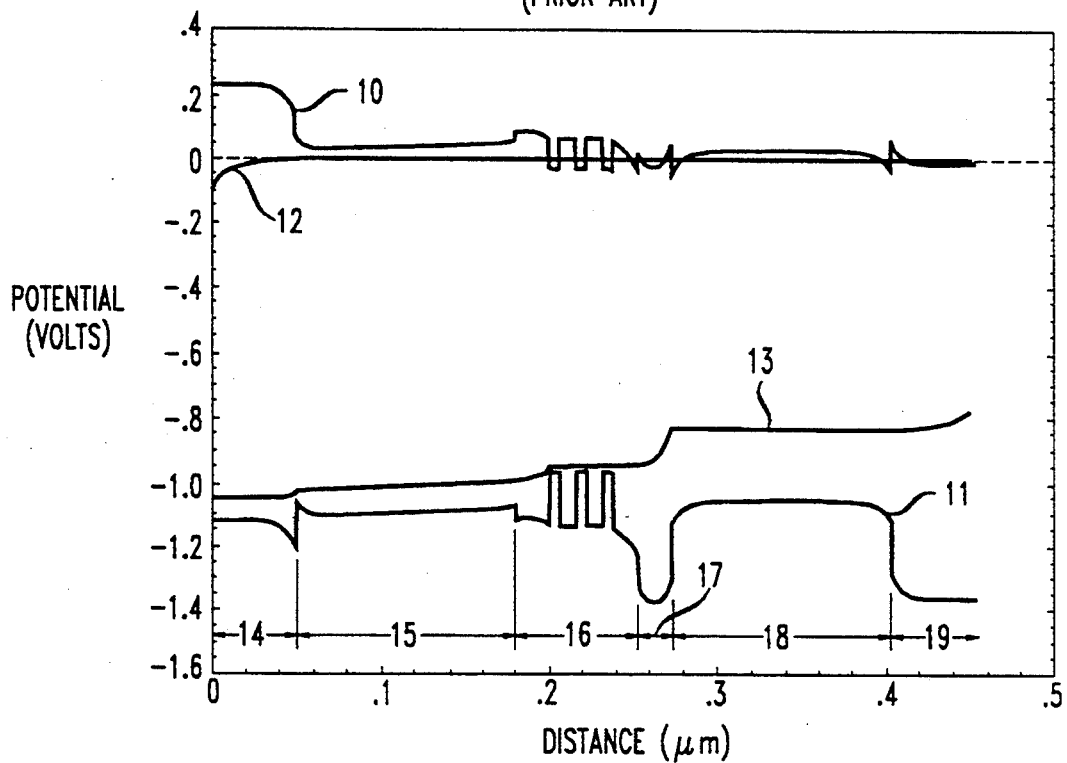
FIGS. 1 and 2 show schematic band edge diagrams of prior art lasers.

FIG. 1 schematically depicts the band edge diagram of a (normally biased) prior art laser, namely, the laser with InP hole barrier disclosed by S. Hausser et al. (op. cit.), and was computed, using the known "PADRE" program (see R. F. Kazarinov et al., *IEEE Journal of Quantum Electronics*, Vol. 30, p. 49 (1994), and relevant references therein), from data provided in the paper. Reference numerals 10 and 11 refer, respectively, to the conduction band edge and valence band edge, respectively, numerals 12 and 13 refer to the electron Fermi level and the hole Fermi level, respectively, and numerals 14–19 refer to the p-cladding layer, p-side waveguide layer, active region, hole stopper layer, n-side waveguide layer, and n-cladding layer, respectively.

Figure 2:
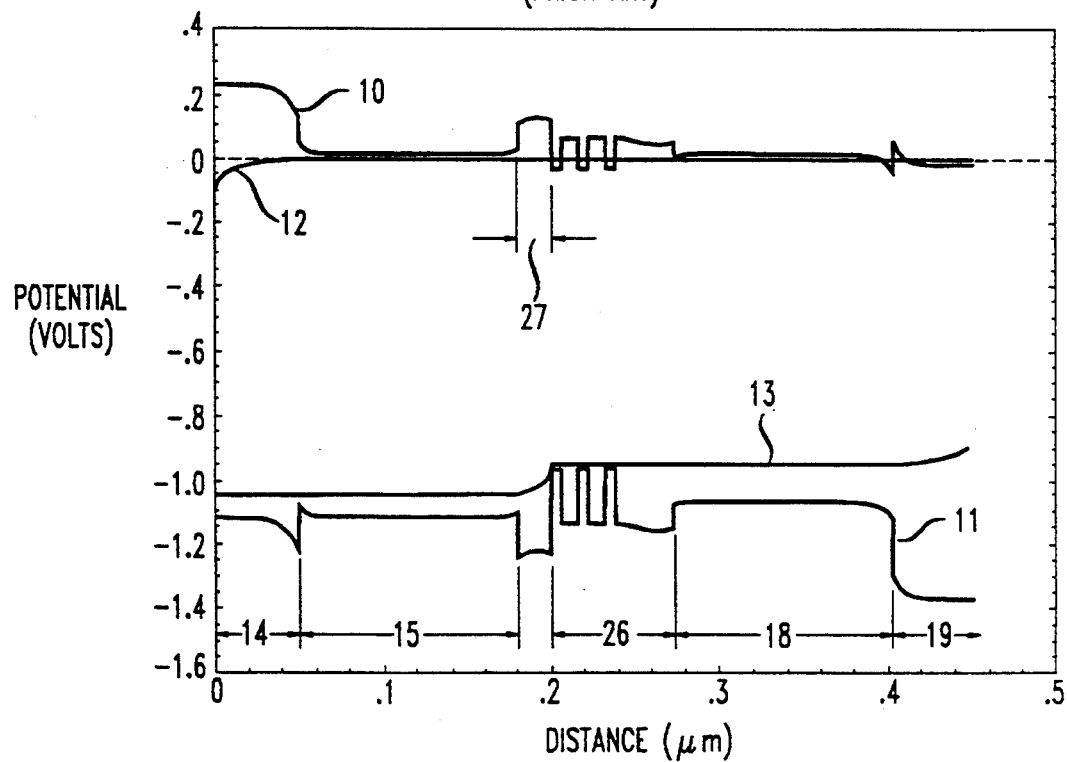

FIG. 2 schematically depicts the computed band edge diagram of another (normally biased) prior art laser, namely, of the laser with InP "electron barrier" described on p. 664 of the above referred to paper by S. Hausser et al. The laser of FIG. 2 is identical to the laser of FIG. 1, except that in the former the InP "barrier" layer is placed to the p-contact side of the quantum well structure. Numerals 26 and 27 refer, respectively, to the active region and the "electron barrier" layer. According to the Hausser et al. paper, the laser of FIG. 2 exhibits hole leakage, and the presence of the InP electron barrier has only a minor effect on electron leakage.

As can be seen from FIG. 2, InP layer 27 provides a relatively insignificant barrier for the (unwanted) flow of electrons from the active region to layer 15, and actually provides a somewhat higher barrier for the (required) flow of holes from layer 15 to the active region, thereby impeding the injection of holes into the active region.

A preferred laser according to the invention has both a hole stopper layer and an electron stopper layer, with the material of the former differing in chemical composition from the material of the latter. Specifically, the materials are selected such that the material of the hole stopper layer has greater electron affinity than the material of the electron stopper layer, and therefore the stopper layers substantially do not impede injection of carriers into the active region. Exemplarily, the laser is a GaAs-based laser, the hole stopper layer is GaAlAs, and the electron stopper layer is GaInP. The remainder of the laser structure can be conventional.

Next we will describe an exemplary particularly preferred embodiment of the invention. Relevant parameters of the layer structure of the laser are recited in Tables I and II. The compositions are selected to be lattice matched to InP. The p-dopant exemplarily is Zn but can be C or any other p-dopant, and the n-dopant exemplarily is Si but can be any other n-dopant.

TABLE I

| LAYER | COMPOSITION | THICKNESS (nm) | DOPING LEVEL ($cm^{-3}$) |
|---|---|---|---|
| cladding layer | p-AlInAs | | $5 \times 10^{17}$ |
| waveguide | p-AlInGaAs (I) | 120 | $2 \times 10^{17}$ |
| electron stopper | p-AlInAs | 10 | $2 \times 10^{17}$ |
| barrier | p-AlInGaAs (II) | 10 | $1 \times 10^{17}$ |
| active | AlInGaAs | 4 | undoped |
| barrier | p-AlInGaAs (II) | 10 | $1 \times 10^{17}$ |
| active | AlInGaAs | 4 | undoped |
| barrier | n-AlInGaAs (II) | 10 | $1 \times 10^{17}$ |
| active | AlInGaAs | 4 | undoped |
| barrier | n-AlInGaAs (II) | 10 | $1 \times 10^{17}$ |
| hole stopper | n-InP | 8 | $1 \times 10^{17}$ |
| waveguide | n-AlInGaAs (I) | 120 | $3 \times 10^{17}$ |
| cladding layer | n-AlInAs | | $1 \times 10^{18}$ |
| substrate | n-InP | · | $2 \times 10^{18}$ |

TABLE II

| MATERIAL | $E_g$ (eV) | n |
|---|---|---|
| AlInAs | 1.47 | 3.16 |
| AlInGaAs | 0.770 | 3.55 |
| AlInGaAs (I) | 1.02 | 3.455 |
| AlInGaAs (II) | 1.190 | 3.322 |
| InP | 1.35 | 3.21 |

As is conventional, expressions such as AlInGaAs are not chemical formulas but merely recitations of the constituent elements. Thus, as an example, the expression "AlInGaAs" is to be understood to stand for the quaternary alloy $Al_{1-x-y}In_xGa_yAs$.

Figure 5:
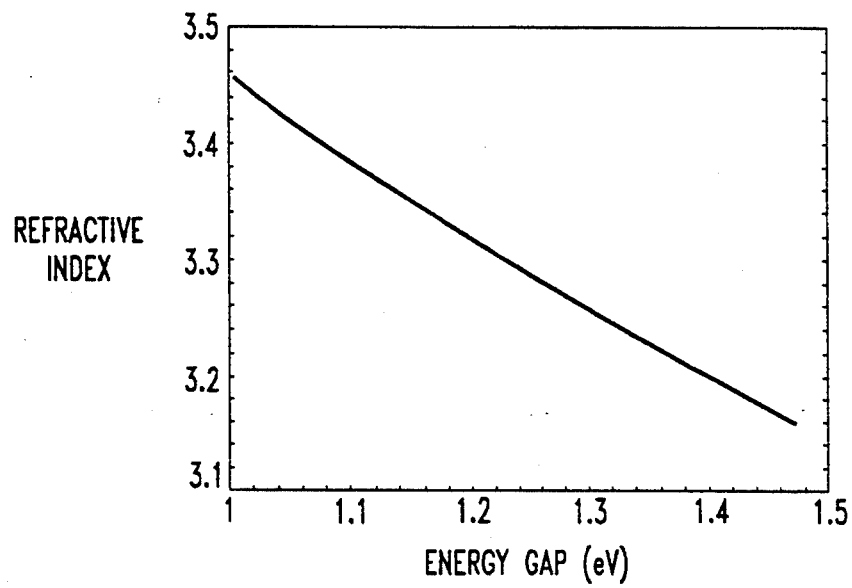
FIG. 5 shows the refractive index of AlInGaAs, lattice matched to InP, as a function of the energy gap.

Table II shows the energy gaps ($E_g$) and refractive indices (n) of the materials of Table I. As those skilled in the art know, a given value of $E_g$ for a particular ternary or quaternary composition can be directly translated into an equivalent wavelength and into a specific composition. For instance, $E_g = 1.47$ eV corresponds to a value x=0.48 for $Al_xIn_{1-x}As$. FIG. 5 shows the refractive index of AlInGaAs as a function of energy gap, for material that is lattice matched to InP.

Figure 3:
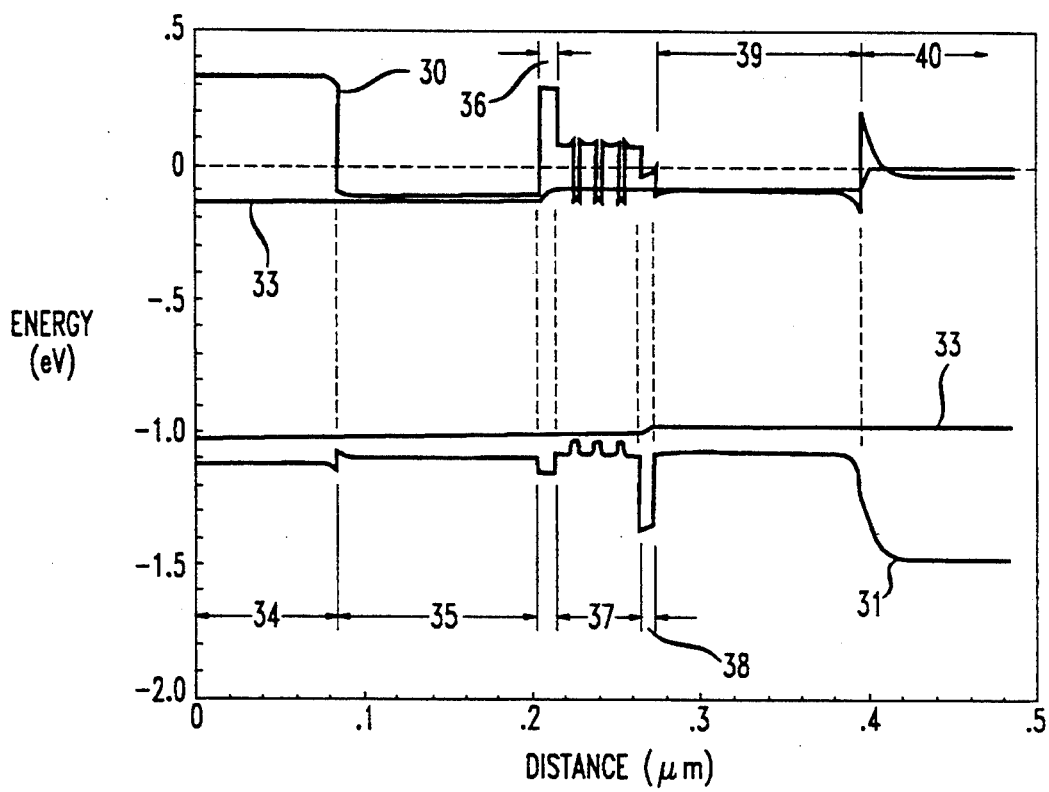
FIGS. 3 and 4 show schematic band edge diagrams of lasers according to the invention.

FIG. 3 shows schematically the band edge diagram of the layer structure according to Tables I and II, under normal bias conditions. Numerals 30 and 31 refer to the conduction band edge and valence band edge, respectively, and numerals 32 and 33 refer to the electron and hole Fermi levels, respectively. Numerals 34–40 refer to p-side cladding layer, p-side waveguide layer, electron stopper layer, active region, hole stopper layer, n-side waveguide layer and n-side cladding layer, respectively.

The band structure shown in FIG. 3 also was computed using the "PADRE" program. The difference between the electron and hole Fermi levels is smaller in the waveguide layers than in the active region. Thus, the total recombination rate in the waveguide layers is reduced due to the presence of the stopper layers. Those skilled in the art will appreciate that the potential spikes at the interfaces between cladding and waveguide layers (especially on the n-side) can readily be reduced by replacing the abrupt interfaces of the structure of Table I by compositionally graded interfaces, and we contemplate lasers with one or more graded interfaces as well as lasers with abrupt interfaces.

InP and AlInAs that is lattice matched to InP have almost equal values of $E_g$, but the electron affinity of the former is about 0.35 eV larger than that of the latter, making AlInAs useful as electron stopper layer material in InP-based lasers. The presence of the stopper layer does not impede the injection of carriers into the active region, but can drastically reduce the thermionic emission of carriers out of the active region.

Figure 4:
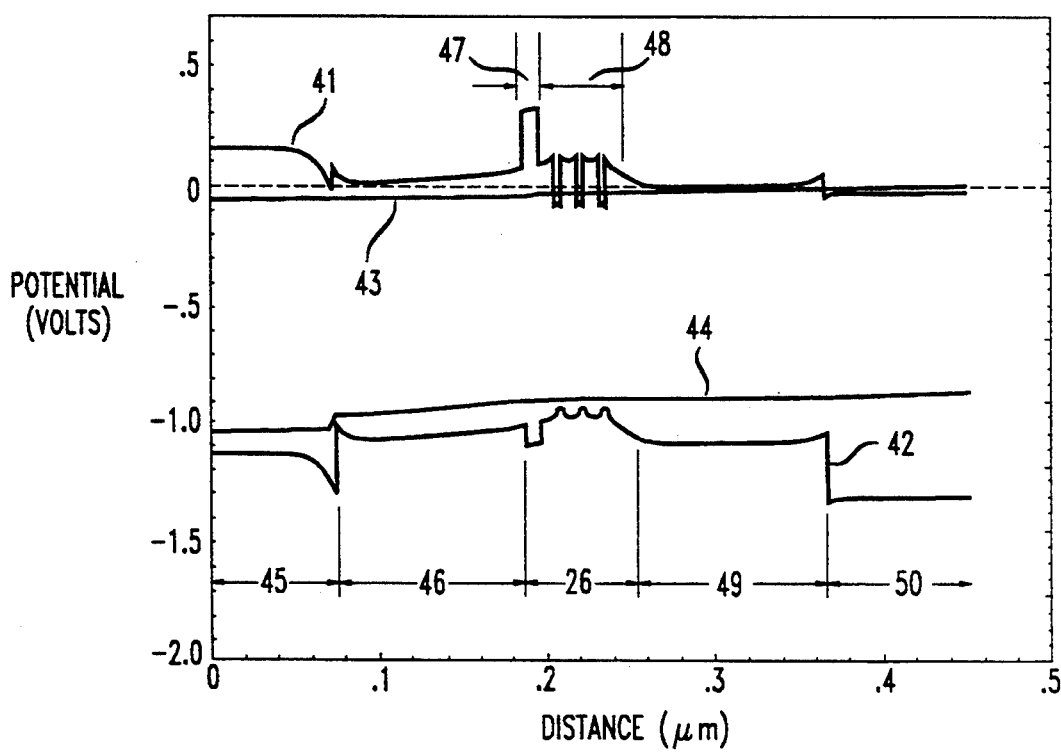

FIG. 4 shows the band diagram of a (normally biased) laser that comprises InP cladding layers and an electron stopper layer but does not comprise a hole stopper layer. Provision of only an appropriate electron stopper layer can result in significant advantages. However, preferred embodiments of the invention generally also comprise a hole stopper layer.

In FIG. 4 numerals 41–44 refer, respectively, to the conduction band edge, valence band edge, electron Fermi level and hole Fermi level, numerals 45–47 refer to the p-doped cladding layer, electron stopper layer and p-side waveguide layer, and numerals 48-50 refer to the active region, n-side waveguide layer and n-doped cladding layer. Exemplarily, layers 45, 46, 47, 49 and 50 are, respectively, InP, AlInGaAs, AlInAs, AlInGaAs and InP. The active region 48 comprises AlInGaAs of two compositions.

The presence of the stopper layers (or layer) in lasers according to the invention can provide increased design freedom, exemplarily substantially decoupling the design of the electrical aspects of the laser from the design of the optical aspects. This exemplarily makes it possible to select the material of the waveguide layers to have a relatively low value of $E_g$ (exemplarily $E_g = 1.02$ eV for a laser designed to lase at 1.3 μm), and therefore having a relatively large value of refractive index. This in turn can result in significant improvement in the optical occupation factor of the active region.

Figure 6:
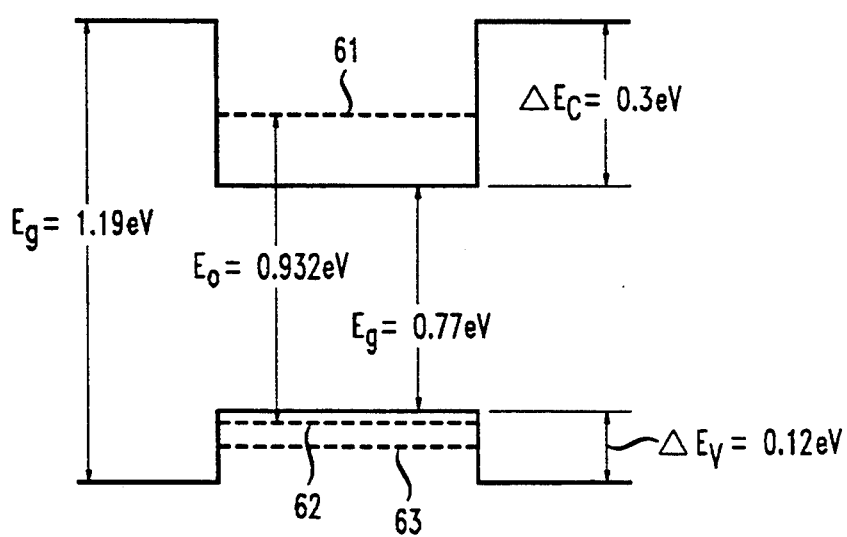
FIG. 6 shows an energy diagram of an exemplary quantum well.

FIG. 6 shows the energy diagram of a 4 nm wide AlInGaAs ($E_g = 0.77$ eV) quantum well between AlInGaAs ($E_g = 1.19$ eV) barriers. In this combination, electrons have only one bound state (61), with energy 0.138 eV. Holes have two bound states (62, 63), with energies 0.024 and 0.086 eV. The energy difference between the two hole states exceeds 2 kT at T=300 K. FIG. 6 also shows the values of $E_g$ of the quantum well and of the barriers, the conduction band offset $\Delta E_c$ and the valence band offset $\Delta E_v$, and the energy difference $E_o$ between the electron state and the lowest hole state. In FIG. 6, the energies of the electron and hole states are counted from the bottom of the corresponding bands.

The quantum well of FIG. 6 has highly quantized electron and hole states, with only the lower hole energy level substantially populated. This substantially ideally 2-dimensional electron and hole gas facilitates high gain for a given carrier concentration.

Figure 7:
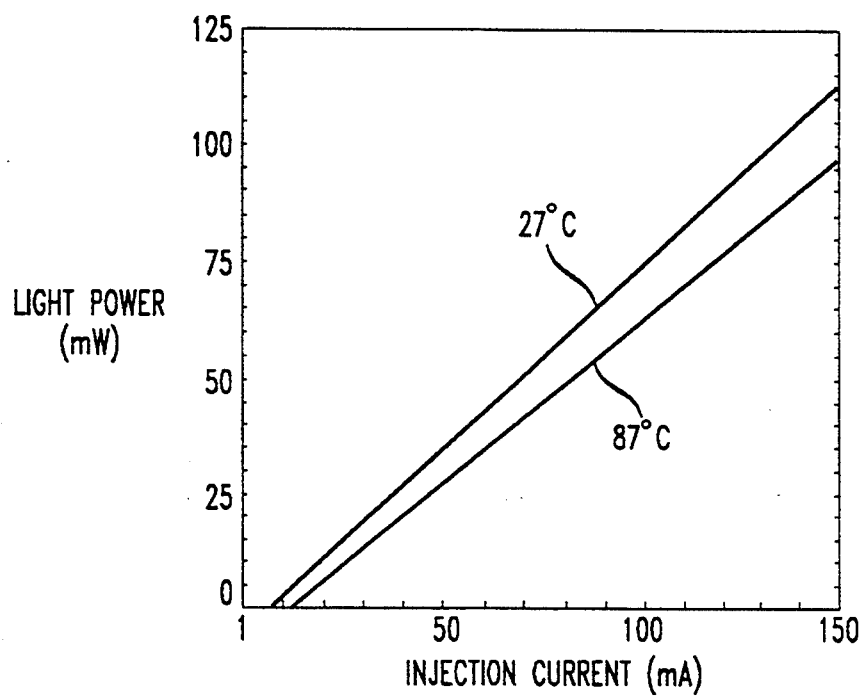
FIG. 7 presents curves of light power vs. injection current for an exemplary laser according to the invention.

FIG. 7 shows computed light power vs. injection current at 27° C. and 87° C. for a laser according to Table I, with 500 μm cavity length and 3 μm mesa width. The corresponding threshold currents are 5 mA and 9 mA, respectively, and the threshold current densities are 330 A/cm² and 594 A/cm². The $T_o$ value of the laser is 102 K, and the slope efficiencies are 80% at 27° C. and 60% at 87° C. Our calculations also indicate that the internal quantum efficiency makes no significant contributions to the external efficiency even at 87° C.

Figure 8:
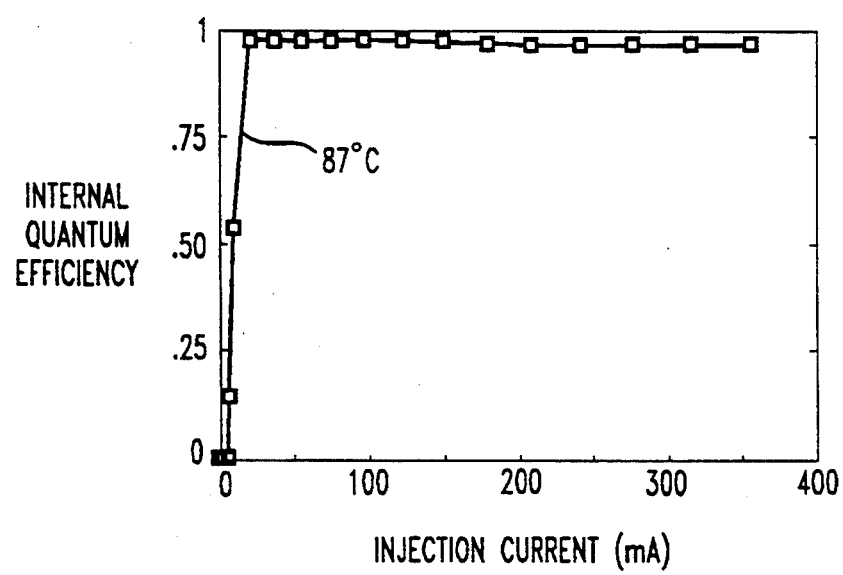
FIG. 8 shows a curve of internal quantum efficiency vs. injection current.

FIG. 8 shows an exemplary curve of internal quantum efficiency vs. injection current for the laser of Table I, at 87° C. The curve shows that substantially all carrier re-combination above threshold takes place in the active region, substantially independent of injection current.

Lasers according to the invention are advantageously used in most, if not all, situations where prior art semiconductor lasers are currently used. Exemplarily, they are used in optical fiber communication systems as sources of signal radiation at, e.g., about 1.3 μm or 1.55 μm. As is well known, such a system comprises, in addition to the signal source, a signal detector and optical fiber that signal-transmissively connects the source and the detector.

We claim:

1. An article comprising a laser comprising a multilayer semiconductor structure on a substrate and contacts that facilitate flowing a current through the multilayer structure, the multilayer structure having a conduction band edge and comprising an n-side waveguide layer, an active region comprising at least one quantum well, and a p-side waveguide layer, with the active region disposed between said waveguide layers;

CHARACTERIZED IN THAT the multilayer structure further comprises an electron stopper layer disposed between said at least one quantum well and the p-side waveguide layer, the electron stopper layer selected to have a bandgap energy $E_g$ at least as large as the bandgap energy of InP, with more than 50% of an energy offset associated with a discontinuity of the conduction band edge, and selected to provide a barrier for the flow of electrons from the active region to the p-side waveguide layer.

2. An article comprising a multilayer semiconductor structure on a substrate and contacts that facilitate allowing a current through the multilayer structure, the multilayer structure having a conduction band edge and comprising an n-side waveguide layer, an active region comprising at least one quantum well, and a p-side waveguide layer, with the active region disposed between said waveguide layers, with the multilayer structure further comprising a hole stopper layer disposed between said at least one quantum well and said n-side waveguide layer, and selected to provide a barrier for the flow of holes from the active region to the n-side waveguide layer;

CHARACTERIZED IN THAT the multilayer structure further comprises an electron stopper layer disposed between said at least one quantum well and the p-side waveguide layer, the electron stopper layer selected to provide a barrier for the flow of electrons from the active region to the p-side waveguide layer and having a chemical composition different from the chemical composition of the hole stopper layer, the chemical compositions of the respective stopper layers selected such that the material of the hole stopper layer has an electron affinity that is greater than the electron affinity of the material of the electron stopper layer.

3. An article according to claim 2, wherein the material of the electron stopper layer has a bandgap energy at least as large as the bandgap energy of InP, with more than 50% of an energy offset associated with a discontinuity of the conduction band edge.

4. An article according to claim 2, wherein the substrate is selected from the group consisting of InP and GaAs.

5. An article according to claim 2, wherein with each of said stopper layers is associated a potential barrier, each said potential barrier being at least 50 meV.

6. An article according to claim 2, further comprising lateral confinement means adapted for lateral confinement of one or both of an electrical current and an optical mode.

7. An article according to claim 4, wherein the active region comprises two or more quantum wells, with a barrier layer between two adjacent quantum wells, each of said two adjacent quantum wells comprising AllnGaAs of a first composition, and the barrier layer comprising AllnGaAs of a second composition.

8. An article according to claim 2, wherein the multilayer structure comprises at least one compositionally graded interface between two adjacent layers.

9. An article according to claim 2, wherein the laser has a threshold current characteristic temperature $T_o > 80K$.

10. An article according to claim 2, wherein the at least one quantum well has a thickness selected to provide a single electron energy level and two or more hole energy levels in the quantum well, with the energy difference between said two hole energy levels being at least 2 kT, where k is Boltzmann's constant and T is a laser operating temperature in degrees Kelvin.

11. An article according to claim 2, wherein the article is an optical fiber communication system comprising, in addition to a signal source that comprises said laser, a signal detector and optical fiber that signal-transmissively connects said signal source and said signal detector.

* * * * *

UNITED STATES PATENT AND TRADEMARK OFFICE
CERTIFICATE OF CORRECTION

PATENT NO.  : 5,448,585
DATED       : September 5, 1995
INVENTOR(S) : Grigory Belenky, et al.

It is certified that error appears in the above-indentified patent and that said Letters Patent is hereby corrected as shown below:

Column 6, lines 40-41, "allowing" should read --flowing--.

Signed and Sealed this

Twenty-sixth Day of December, 1995

Attest:

BRUCE LEHMAN

*Attesting Officer*    *Commissioner of Patents and Trademarks*

(12) EX PARTE REEXAMINATION CERTIFICATE (7101st)
United States Patent
Belenky et al.

(10) Number: US 5,448,585 C1
(45) Certificate Issued: Oct. 13, 2009

(54) ARTICLE COMPRISING A QUANTUM WELL LASER

(75) Inventors: Grigory Belenky, Scotch Plains, NJ (US); Rudolf F. Kazarinov, Martinsville, NJ (US)

(73) Assignee: Agere Systems Inc., Allentown, PA (US)

Reexamination Request:
  No. 90/008,977, Dec. 27, 2007

Reexamination Certificate for:
  Patent No.: 5,448,585
  Issued: Sep. 5, 1995
  Appl. No.: 08/267,727
  Filed: Jun. 29, 1994

Certificate of Correction issued Dec. 26, 1995.

(51) Int. Cl.
  *H01S 5/00* (2006.01)
  *H01S 5/20* (2006.01)
  *H01S 5/32* (2006.01)
  *H01S 5/34* (2006.01)
  *H01S 5/343* (2006.01)

(52) U.S. Cl. .................................... 372/45.01
(58) Field of Classification Search .......... None
  See application file for complete search history.

(56) References Cited

U.S. PATENT DOCUMENTS

| | | | |
|---|---|---|---|
| 4,163,237 A | 7/1979 | Dingle et al. | 257/20 |
| 4,875,216 A | 10/1989 | Thornton et al. | 372/45.01 |
| 4,881,238 A | 11/1989 | Chinone et al. | 372/68 |
| 4,882,734 A | 11/1989 | Scifres et al. | 372/45.012 |
| 4,894,833 A | 1/1990 | Carlin | 372/44.01 |
| 5,068,867 A | 11/1991 | Hasenberg et al. | 372/45.012 |
| 5,073,805 A | 12/1991 | Nomura et al. | 357/17 |
| 5,138,626 A | 8/1992 | Yap | 372/46.016 |
| 5,175,739 A | 12/1992 | Takeuchi et al. | 372/45.01 |
| 5,179,615 A | 1/1993 | Tanaka et al. | 385/131 |
| 5,309,465 A | 5/1994 | Antreasyan et al. | 372/43.01 |
| 5,309,467 A | 5/1994 | Terakado | 372/45.01 |
| 5,331,655 A | 7/1994 | Harder et al. | 372/45.01 |
| 5,347,526 A | 9/1994 | Suzuki et al. | 372/20 |
| 5,383,214 A | 1/1995 | Kidoguchi et al. | 372/46.014 |
| 5,392,306 A | 2/1995 | Usami et al. | 372/45.01 |
| 5,455,429 A | 10/1995 | Paoli et al. | 257/20 |
| 5,459,747 A | 10/1995 | Takiguchi et al. | 372/50.11 |
| 5,475,700 A | 12/1995 | Iwata | 372/45.01 |
| 5,544,187 A | 8/1996 | Kadoiwa et al. | 372/45.012 |

(Continued)

FOREIGN PATENT DOCUMENTS

| | | |
|---|---|---|
| DE | 3220214 A1 | 2/1983 |
| DE | 3441201 A1 | 5/1985 |
| DE | 19527000 A1 | 2/1996 |
| DE | 69714815 T2 | 4/2003 |
| DE | 69730291 T2 | 9/2005 |

(Continued)

OTHER PUBLICATIONS

"1.3 μm Decoupled Confinement Heterostructure Lasers Grown by Chemical Beam Epitaxy", by S. Hausser et al., Applied Physics Letters, vol. 62(7), p. 663., Feb. 15, 1993.

(Continued)

*Primary Examiner*—Linh M. Nguyen

(57) ABSTRACT

The quantum well lasers according to the invention comprise an electron stopper layer that provides a barrier for the flow of electrons from the active region to the p-side waveguide and cladding layers and in preferred embodiments also comprise a hole stopper layer that provides a barrier for the flow of holes from the active region to the n-side waveguide and cladding layers. An exemplary InP-based laser according to the invention comprises AlInGaAs quantum well layers and barrier layers, and an AlInAs electron stopper layer and an InP hole stopper layer. Lasers according to the invention can have relatively low temperature dependence of, e.g., threshold current and/or external quantum efficiency, and may be advantageously incorporated in, e.g., optical fiber communication systems.

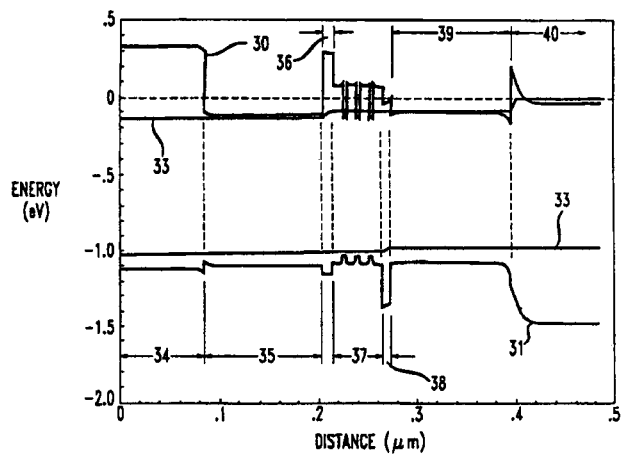

U.S. PATENT DOCUMENTS

| | | | | |
|---|---|---|---|---|
| 5,568,501 | A | 10/1996 | Otsuka et al. | 372/46.01 |
| 5,604,762 | A | 2/1997 | Morinaga et al. | 372/43.01 |
| 5,606,176 | A | 2/1997 | Nitta | 257/18 |
| 5,636,236 | A | 6/1997 | Tada et al. | 372/45 |
| 5,642,371 | A | 6/1997 | Tohyama et al. | 372/45.01 |
| 5,642,372 | A | 6/1997 | Tomita | 372/45.01 |
| 5,737,353 | A | 4/1998 | Sasaki | 345/685 |
| 5,974,068 | A | 10/1999 | Adachi et al. | 372/46 |
| 5,987,046 | A | 11/1999 | Kobayashi et al. | 372/45.01 |

FOREIGN PATENT DOCUMENTS

| | | |
|---|---|---|
| EP | 0545262 B1 | 6/1933 |
| EP | 0536757 A1 | 4/1993 |
| EP | 0540799 A1 | 5/1993 |
| EP | 0575684 A1 | 12/1993 |
| EP | 0578836 B1 | 1/1994 |
| JP | 5-102600 | 4/1933 |
| JP | 60-133781 | 7/1985 |
| JP | 61-15385 | 1/1986 |
| JP | 61-73335 | 4/1986 |
| JP | 61-131583 | 6/1986 |
| JP | 62-183588 | 8/1987 |
| JP | 62-188392 | 8/1987 |
| JP | 62-249496 | 10/1987 |
| JP | 64-7587 | 1/1989 |
| JP | 3-71679 | 3/1991 |
| JP | 4-218994 | 8/1992 |
| JP | 5-3367 | 1/1993 |
| JP | 5-7051 | 1/1993 |
| WO | WO-93/16513 | 8/1993 |

OTHER PUBLICATIONS

Zah, C.E. et al., "High–performance uncooled 1.3 μm $Al_xGa_yIn_{1-x-y}AS/InP$ strained–layer quantum–well lasers for fiber–in–the–loop applications," OFC '94 Tech. Digest, 1994, pp. 204–205, vol. 4.

"1.57 μm Strained–Layer Quantum–Well GaInAlAs Ridge–Waveguide Laser Diodes with High Temperature (130° C.) and Ultrahigh–Speed (17 GHz) Performance," B. Stegmüller, B. Borchert and R. Gessner, IEEE Photonics Technology Letters, vol. 5, No. 6, Jun. 1993.

"Fundamentals of Photonics" Bahaa E.A. Saleh, Malvin Carl Teich, 1991, pp. 874–917.

S. Hausser et al., "1.3 μm Multiquantum Well Decoupled Confinement Heterostructure (MQW–DCH) Laser Diodes," IEEE Jnl. of Quantum Electronics, Jun. 1993, pp. 1596–1600, vol. 29, No. 6.

Asano, Takeharu et al., "100–mW Kink–Free Blue–Violet Laser Diodes with Low Aspect Ratio," IEEE Jnl. of Quantum Electronics, Jan. 2003, pp. 135–140, vol. 39, No. 1.

Jiang, D. S. et al., "A Study of Resonant Raman Scattering in GaInAs/AlInAs Multiple Quantum Wells," Superlattices and Microstructures, 1992, pp. 273–277, vol. 12, No. 2, Academic Press.

Uenohara, Hiroyuki et al., "Analysis of Electron Wave Reflectivity and Leakage Current of Multi Quantum Barrier: MQB," Inst. of Electronics, Info & Communication Engineers, Jun. 25, 1987, pp. 851–857, vol. J70–S, No. 6.

Ikeda, M. et al. "Blue–Violet Laser Diodes Suitable for Blu–ray Disk," Phys. Stat. Sol. (a), 2002, pp. 407–413, 194, No. 2, Wiley–VCH.

Tessler, N. et al., "Distributed nature of quantum–well lasers," Appl. Phys. Lett., Jan. 4, 1993, pp. 10–12, vol. 62, No. 1, Amer. Inst. of Physics.

Cebulla, U. et al., "Electron capture processes in optically excited $In_{0.53}Ga_{0.47}As/InP$," Appl. Phys. Lett., Sep. 4, 1989, pp. 933–935, vol. 55, No. 10, Amer. Inst. of Physics.

Takagi, Takeshi et al., "Enhancement of Carrier Confinement Effect of MQB in AlGaInP Visible Lasers," 1991 Spring Nat'l. Convention Record, Inst. of Electronics, Info. & Comm. Engineers, 1991, pp. 4–446 to 4–447, Part 4.

Hirayama, Hideki et al., "Estimation of carrier capture time of quantum–well lasers by spontaneous emission spectra," Appl. Phys. Lett., Nov. 16, 1992, pp. 2398–2400, vol. 61 No. 20, Amer. Inst. of Physics.

Chao, C. P. et al., "Fabrication of Low–Threshold InGaAs/GaAs Ridge Waveguide Lasers by Using In Situ Monitored Reactive Ion Etching," IEEE Photonics Tech. Letters., Jul. 1991, pp. 585–587, vol. 3, No. 7.

Casey, H. C. et al., "$GaAs-Al_xGa_{1-x}As$ heterostructure laser with separate optical and carrier confinement," Jnl. of App. Phys., Jan. 1, 1974, pp. 322–333, vol. 45, No. 1, Amer. Inst. of Physics.

Thijs, Peter et al., High–Performance 1.5 μm Wavelength InGaAs–InGaAsP Strained Quantum Well Lasers and Amplifiers, IEEE Jnl. of Quantum Electronics, Jun. 1991, pp. 1426–1439, vol. 27, No. 6.

Takeya, M. et al., "High–Power AlGaInN Lasers," Phys. Stat. Sol. (a), 2002, pp. 269–276, 192, No. 2, Wiley–VCH.

Arimoto, S. et al., "High–Power AlGaInP Visible Laser Diode," IEICE Tech. Rpt, 1992, 77–82, vol. 92, No. 53.

Rode, D. L., "How much Al in the AlGaAs–GaAs laser?," Jnl. of App. Phys., Sep. 1974, pp. 3887–3891, vol. 45, No. 9.

Nakamura, Shuji et al., "InGaN–Based Multi–Quantum–Well Structure Laser Diodes," Jpn. J. Appl. Phys., Jan. 1996, pp. L–74–L76, vol. 35, Part 2, No. 1B.

Cingolani, R. et al., "Radiative recombination processes of the many–body states in multiple quantum wells," Physical Review B, Aug. 15, 1990, pp. 2893–2903, vol. 42, No. 5, The Amer. Physical Soc.

Daiminger, F. et al., "Time–Resolved Investigation of Recombination and Carrier Capture in Spatially Homogeneous 2D Electon–Hole Plasmas," Phys. Stat. Sol. (b), 1992, pp. 397–403, vol. 173, No. 1, Akademie Verlag.

Eng, L. E. et al., "Microampere threshold current operation of GaAs and strained InGaAs quantum well lasers at low temperature (5 K)," Appl. Phys. Lett., Jun. 17, 1991, pp. 2752–2754, vol. 58, No. 24, Amer. Inst. of Physics.

Eng. L. E. et al., "Submilliampere threshold current pseudomorphic InGaAs/A/GaAs buried–heterostructure quantum well lasers grown by molecular beam epitaxy," Appl. Phys. Lett., Oct. 2, 1989, pp. 1378–1379, vol. 55, No. 14, Amer. Inst. of Physics.

Genoe, J. et al., "pnp resonant tunneling light emitting transistor," Appl. Phys. Lett., Aug. 31, 1992, pp. 1051–1053, vol. 61, No. 9, Amer. Inst. of Physics.

Ghiti, A. et al., "Wave Function Engineering in Compressive– and Tensile–Strained Laser Structures," Superlattices and Microstructures, 1994, pp. 345–350, vol. 15, No. 3, Academic Press Ltd.

Weller, A. et al., "Model Calculations of Diffusion Limited Trapping Dynamics in Quantum Well Laser Structures," Appl. Phys. A., 1989, pp. 509–515, vol. 48, Springer–Verlag.

Nemoto, Kazuhiko et al., "Monolithic–integrated two–wavelength laser diodes for digital–versatile–disk/compact–disk playback," Appl. Phys. Lett., Apr. 16, 2001, pp. 2270–2272, vol. 78, No. 16, Amer. Inst. of Physics.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–2 are determined to be patentable as amended.

Claims 3–9, dependent on an amended claim, are determined to be patentable.

New claim 12 is added and determined to be patentable.

Claims 10 and 11 were not reexamined.

1. An article comprising a laser comprising a multilayer semiconductor structure on a substrate and contacts that facilitate flowing a current through the multilayer structure, the multilayer structure having a conduction band edge and comprising an n-side waveguide layer, an active region comprising *i*) at least one quantum well *and ii) at least two barrier layers, each quantum well disposed between barrier layers, said active region containing all the quantum wells and all the barrier layers*, and a p-side waveguide layer, with the active region disposed between said waveguide layers; CHARACTERIZED IN THAT
   the multilayer structure further comprises an electron stopper layer, *said electron stopper layer being i) separate from all the barrier layers and ii)* disposed between [said at least one quantum well and] *the p-side waveguide layer and the barrier layer disposed closest to* the p-side waveguide layer, the electron stopper layer selected to have a bandgap energy $E_g$ at least as large as the bandgap energy of InP, with more than 50% of an energy offset associated with a discontinuity of the conduction band edge, and selected to provide a barrier for the flow of electrons from the active region to the p-side waveguide layer.

2. An article comprising a multilayer semiconductor structure on a substrate and contacts that facilitate flowing a current through the multilayer structure, the multilayer structure having a conduction band edge and comprising an n-side waveguide layer, an active region comprising *i*) at least one quantum well *and ii) at least two barrier layers, each quantum well disposed between barrier layers, said active region containing all the quantum wells and all the barrier layers*, and a p-side waveguide layer, with the active region disposed between said waveguide layers, with the multilayer structure further comprising a hole stopper layer disposed between said at least one quantum well and said n-side waveguide layer, and selected to provide a barrier for the flow of holes from the active region to the n-side waveguide layer;
   CHARACTERIZED IN THAT
   the multilayer structure further comprises an electron stopper layer, *said electron stopper layer being i) separate from all the barrier layers and ii)* disposed between [said at least one quantum well and] *the p-side waveguide layer and the barrier layer disposed closest to* the p-side waveguide layer, the electron stopper layer selected to provide a barrier for the flow of electrons from the active region to the p-side waveguide layer and having a chemical composition different from the chemical composition of the hole stopper layer, the chemical compositions of the respective stopper layers selected such that the material of the hole stopper layer has an electron affinity that is greater than the electron affinity of the material of the electron stopper layer.

*12. An article comprising a multilayer semiconductor structure on a substrate and contacts that facilitate flowing a current through the multilayer structure, the multilayer structure having a conduction band edge and comprising an n-side waveguide layer, an active region comprising at least one quantum well, and a p-side waveguide layer, with the active region disposed between said waveguide layers, with the multilayer structure further comprising a hole stopper layer disposed between said at least one quantum well and said n-side waveguide layer, and selected to provide a barrier for the flow of holes from the active region to the n-side waveguide layer;*
   *CHARACTERIZED IN THAT*
   *the multilayer structure further comprises an electron stopper layer disposed between said at least one quantum well and the p-side waveguide layer, the electron stopper layer selected to provide a barrier for the flow of electrons from the active region to the p-side waveguide layer and having a chemical composition different from the chemical composition of the hole stopper layer, the chemical compositions of the respective stopper layers selected such that the material of the hole stopper layer has an electron affinity that is greater than the electron affinity of the material of the electron stopper layer, wherein the at least one quantum well has a thickness selected to provide a single electron energy level and two or more hole energy levels in the quantum well, with the energy difference between said two hole energy levels being at least 2 kT, where k is Boltzmann's constant and T is a laser operating temperature in degrees Kelvin.*

* * * * *

EX PARTE REEXAMINATION CERTIFICATE (8421st)
United States Patent
Belenky et al.

(10) Number: US 5,448,585 C2
(45) Certificate Issued: Jul. 19, 2011

(54) ARTICLE COMPRISING A QUANTUM WELL LASER

(75) Inventors: Grigory Belenky, Scotch Plains, NJ (US); Rudolf F. Kazarinov, Martinsville, NJ (US)

(73) Assignee: Agere Systems Inc., Allentown, PA (US)

Reexamination Request:
No. 90/011,001, May 18, 2010

Reexamination Certificate for:
Patent No.: 5,448,585
Issued: Sep. 5, 1995
Appl. No.: 08/267,727
Filed: Jun. 29, 1994

Reexamination Certificate C1 5,448,585 issued Oct. 13, 2009

Certificate of Correction issued Dec. 26, 1995.

(51) Int. Cl.
| | |
|---|---|
| H01S 5/00 | (2006.01) |
| H01S 5/20 | (2006.01) |
| H01S 5/32 | (2006.01) |
| H01S 5/34 | (2006.01) |
| H01S 5/343 | (2006.01) |

(52) U.S. Cl. .................................................. 372/45.01
(58) Field of Classification Search .......................... None
See application file for complete search history.

(56) References Cited

U.S. PATENT DOCUMENTS

| | | | |
|---|---|---|---|
| 4,163,237 A | 7/1979 | Dingle et al. |
| 4,875,216 A | 10/1989 | Thornton et al. |
| 4,881,238 A | 11/1989 | Chinone et al. |
| 4,882,734 A | 11/1989 | Scifres et al. |
| 4,894,833 A | 1/1990 | Carlin |
| 5,068,867 A | 11/1991 | Hasenberg et al. |
| 5,073,805 A | 12/1991 | Nomura et al. |
| 5,138,626 A | 8/1992 | Yap |
| 5,175,739 A | 12/1992 | Takeuchi et al. |
| 5,179,615 A | 1/1993 | Tanaka et al. |
| 5,251,224 A | 10/1993 | Irikawa et al. |
| 5,253,264 A | 10/1993 | Suzuki et al. |
| 5,309,465 A | 5/1994 | Antreasyan et al. |
| 5,309,467 A | 5/1994 | Terakado |
| 5,331,655 A | 7/1994 | Harder et al. |
| 5,347,526 A | 9/1994 | Suzuki et al. |
| 5,383,214 A | 1/1995 | Kidoguchi et al. |
| 5,392,306 A | 2/1995 | Usami et al. |
| 5,455,429 A | 10/1995 | Paoli et al. |
| 5,459,747 A | 10/1995 | Takiguchi et al. |
| 5,475,700 A | 12/1995 | Iwata |
| 5,544,187 A | 8/1996 | Kadoiwa et al. |
| 5,568,501 A | 10/1996 | Otsuka et al. |
| 5,604,762 A | 2/1997 | Morinaga et al. |
| 5,606,176 A | 2/1997 | Nitta |

(Continued)

FOREIGN PATENT DOCUMENTS

DE    3220214 A1    2/1983

(Continued)

OTHER PUBLICATIONS

Hausser et al., "1.3 μm Multiquantum Well Decoupled Confinement Heterostructure (MQW–DCH) Laser Diodes," IEEE Journal of Quantum Electronics, Jun. 1993, 29(6):1596–1600.

(Continued)

*Primary Examiner* — Deandra M Hughes

(57) ABSTRACT

The quantum well lasers according to the invention comprise an electron stopper layer that provides a barrier for the flow of electrons from the active region to the p-side waveguide and cladding layers and in preferred embodiments also comprise a hole stopper layer that provides a barrier for the flow of holes from the active region to the n-side waveguide and cladding layers. An exemplary InP-based laser according to the invention comprises AlInGaAs quantum well layers and barrier layers, and an AlInAs electron stopper layer and an InP hole stopper layer. Lasers according to the invention can have relatively low temperature dependence of, e.g., threshold current and/or external quantum efficiency, and may be advantageously incorporated in, e.g., optical fiber communication systems.

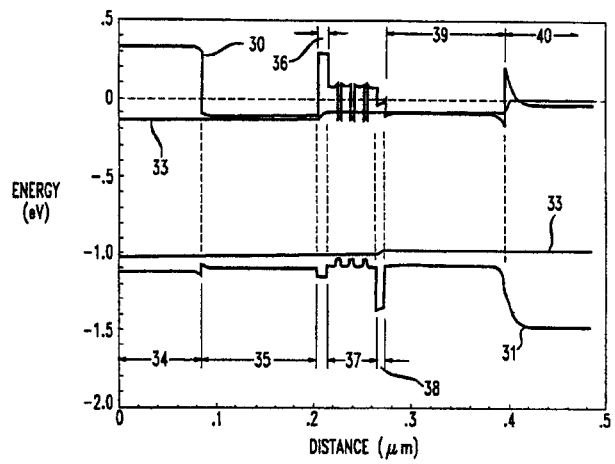

U.S. PATENT DOCUMENTS

| | | | |
|---|---|---|---|
| 5,636,236 | A | 6/1997 | Tada et al. |
| 5,642,371 | A | 6/1997 | Tohyama et al. |
| 5,642,372 | A | 6/1997 | Tomita |
| 5,737,353 | A | 4/1998 | Sasaki |
| 5,974,068 | A | 10/1999 | Adachi et al. |
| 5,987,046 | A | 11/1999 | Kobayashi et al. |

FOREIGN PATENT DOCUMENTS

| | | | |
|---|---|---|---|
| DE | 3441201 | A1 | 5/1985 |
| DE | 19527000 | A1 | 2/1996 |
| DE | 69714815 | T2 | 4/2003 |
| DE | 69730291 | T2 | 9/2005 |
| EP | 0536757 | A1 | 4/1993 |
| EP | 0540799 | A1 | 5/1993 |
| EP | 0545262 | B1 | 6/1993 |
| EP | 0 575 684 | A1 | 12/1993 |
| EP | 0575684 | A1 | 12/1993 |
| EP | 0578836 | B1 | 1/1994 |
| JP | 60-133781 | | 7/1985 |
| JP | 61-15385 | | 1/1986 |
| JP | 61-73335 | | 4/1986 |
| JP | 61-131583 | | 6/1986 |
| JP | 62-183588 | | 8/1987 |
| JP | 62-188392 | | 8/1987 |
| JP | 62-249496 | | 10/1987 |
| JP | 64-7587 | | 1/1989 |
| JP | 3-71679 | | 3/1991 |
| JP | 4-218994 | | 8/1992 |
| JP | 5-3367 | | 1/1993 |
| JP | 5-7051 | | 1/1993 |
| JP | 5-102600 | | 4/1993 |
| WO | WO 93/16513 | A1 | 8/1993 |
| WO | WO-93/16513 | | 8/1993 |

OTHER PUBLICATIONS

Morgan et al., "Physics and technology of heterojunction devices," IEE Materials and Devices Series 8, 1991, Peter Prergrinus Ltd., 326 pages.

S. Hausser et al., "1.3 μm Multiquantum Well Decoupled Confinement Heterostructure (MQW–DCH) Laser Diodes," IEEE Jnl. of Quantum Electronics, Jun. 1993, pp. 1596–1600, vol. 29, No. 6.

Asano, Takeharu et al., "100–mW Kink–Free Blue–Violet Laser Diodes with Low Aspect Ratio", IEEE Jnl. of Quantum Electronics, Jan. 2003, pp. 135–140, vol. 39, No. 1.

Jiang, D.S. et al., "A Study of Resonant Raman Scattering in GaInAs/AlInAs Multiple Quantum Wells," Superlattices and Microstructures, 1992, pp. 273–277, vol. 12, No. 2, Academic Press.

Uenohara, Hiroyuki et al., "Analysis of Electron Wave Reflectivity and Leakage Current of Multi Quantum Barrier : MQB," Inst. of Electronics, Info. & Communication Engineers, Jun. 25, 1987, pp. 851–857, vol. J70–C, No. 6.

Ikeda, M. et al., "Blue–Violet Laser Diodes Suitable for Blu–ray Disk," Phys. Stat. Sol. (a), 2002, pp. 407–413, 194, No. 2, Wiley–VCH.

Tessler, N. et al., "Distributed nature of quantum–well lasers," Appl. Phys. Lett., Jan. 4, 1993, pp. 10–12 vol. 62 No. 1, Amer. Inst. of Physics.

Cebulla, U. et al., "Electron capture processes in optically excited $In_{0.53}Ga_{0.47}As/InP$," Appl. Phys. Lett., Sep. 4, 1989, pp. 933–935, vol. 55 No. 10, Amer. Inst. of Physics.

Takagi, Takeshi et al., "Enhancement of Carrier of Confinement Effect by MQB in AlGaInP Visible Lasers," 1991 Spring Nat'l. Convention Record, Inst. of Electronics, Info. & Comm. Engineers, 1991, pp. 4–446 to 4–447, Part 4.

Hirayama, Hideki et al., "Estimation of carrier capture time of quantum–well lasers by spontaneous emission spectra," Appl. Phys. Lett., Nov. 16, 1992, pp. 2398–2400, vol. 61, No. 20, Amer. Inst. of Physics.

Chao, C. P. et al., "Fabrication of Low–Threshold InGaAs/GaAs Ridge Waveguide Lasers by Using In Situ Monitored Reactive Ion Etching," IEEE Photonics Tech. Letters., Jul. 1991, pp. 585–587, vol. 3, No. 7.

Casey, H. C. et al., "GaAs–$Al_xGa_{1-x}As$ heterostructure laser with separate optical and carrier confinement," Jnl. of App. Phys., Jan. 1, 1974, pp. 322–333, vol. 45, No. 1, Amer. Inst. of Physics.

Thijs, Peter et al., High–Performance 1.5 μm Wavelength InGaAs–InGaAsP Strained Quantum Well Lasers and Amplifiers, IEEE Jnl. of Quantum Electronics, Jun. 1991, pp. 1426–1439, vol. 27, No. 6.

Takeya, M. et al., "High–Power AlGaInN Lasers," Phys. Stat. Sol. (a), 2002, pp. 269–276, 192, No. 2, Wiley–VCH.

Arimoto, S. et al., "High–Power AlGaInP Visible Laser Diode," IEICE Tech. Rpt, 1992, pp. 77–82, vol. 92, No. 53.

Rode, D. L., "How much Al in the AlGaAs–GaAs laser?," Jnl. of App. Phys., Sep. 1974, pp. 3887–3891, vol. 45, No. 9.

Nakamura, Shuji et al., "InGaN–Based Multi–Quantum–Well Structure Laser Diodes," Jpn. J. Appl. Phys., Jan. 1996, pp. L–74–L76, vol. 35, Part 2, No. 1B.

Cingolani, R. et al., "Radiative recombination processes of the many–body states in multiple quantum wells," Physical Review B, Aug. 15, 1990, pp. 2893–2903, vol. 42, No. 5, The Amer. Physical Soc.

Daiminger, F. et al., "Time–Resolved Investigation of Recombination and Carrier Capture in Spatially Homogeneous 2D Electron–Hole Plasma," Phys. Stat. Sol. (b), 1992, pp. 397–403, vol. 173, No. 1, Akademie Verlag.

Eng, L. E. et al., "Microampere threshold current operation of GaAs and strained InGaAs quantum well lasers at low temperatures (5 K)," Appl. Phys. Lett., Jun. 17, 1991, pp. 2752–2754, vol. 58, No. 24, Amer. Inst. of Physics.

Eng, L. E. et al., "Submilliampere threshold current pseudomorphic InGaAs/AlGaAs buried–heterostructure quantum well lasers grown by molecular beam epitaxy," Appl. Phys. Lett., Oct. 2, 1989, pp. 1378–1379, vol. 55, No. 14, Amer. Inst. of Physics.

Genoe, J. et al., "pnp resonant tunneling light emitting transistor," Appl. Phys. Lett., Aug. 31, 1992, pp. 1051–1053, vol. 61, No. 9, Amer. Inst. of Physics.

Ghiti, A. et al., "Wave Function Engineering in Compressive– and Tensile–Strained Laser Structures," Superlattices and Microstructures, 1994, pp. 345–350, vol. 15, No. 3, Academic Press Ltd.

Weller, A. et al., "Model Calculations of Diffusion Limited Trapping Dynamics in Quantum Well Laser Structures," Appl. Phys. A., 1989, pp. 509–515, vol. 48, Springer–Verlag.

Nemoto, Kazuhiko et al., "Monolithic–Integrated two–wavelength laser diodes for digital–versatile–disk/compact–disk playback," Appl. Phys. Lett., Apr. 16, 2001, pp. 2270–2272, vol. 78, No. 16, Amer. Inst. of Physics.

Zah, C.E. et al., "High–performance uncooled 1.3μm $Al_xGa_yIn_{1-x-y}As$/InP strained–layer quantum–well lasers for fibers–in–the–loop applications," OFC '94 Tech. Digest, 1994, pp. 204–205, vol. 4.

"Memorandum Opinion and Order," filed on May 15, 2008 in the United States District Court Eastern Division of Texas, Marshall Division, Document 178, Case 2:06–cv–00079–TJW–CE.

Stegmüller et al., "1.57 μm Strained–Layer Quantum–Well GaInAlAs Ridge–Waveguide Laser Diodes with High Temperature (130° C.) and Ultrahigh–Speed (17 GHz) Performance," IEEE Photonics Technology Letters, Jun. 1993, vol. 5, No. 6.

Bahaa et al., "Fundamentals of Photonics", 1991, pp. 874–917.

Tessler et al., "On Carrier Injection and Gain Dynamics in Quantum Well Lasers", IEEE Journal of Quantum Electronics, vol. 29, No. 6, Jun. 1993, pp. 1586–1595.

Zah et al., "High–Performance Uncolled 1.3–μm $Al_xGa_yIn_{1-x-y}As$/InP Strained–Layer Quantum–Well Lasers for Subscriber Loop Applications", IEEE Journal of Quantum Electronics, vol. 30, No. 2, Feb. 1994, pp. 511–523.

US 5,448,585 C2

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

New claims 13-22 are added and determined to be patentable.

Claims 2-12 were not reexamined.

1. An article comprising a laser comprising a multilayer semiconductor structure on a substrate and contacts that facilitate flowing a current through the multilayer structure, the multilayer structure having a conduction band edge and comprising an n-side waveguide layer, an active region comprising i) at least one quantum well and ii) at least two barrier layers, each quantum well disposed between barrier layers, said active region containing all the quantum wells and all the barrier layers, and a p-side waveguide layer, with the active region disposed between said waveguide layers;
   CHARACTERIZED IN THAT
   the multilayer structure further comprises an electron stopper layer, said electron stopper layer being i) separate from all the barrier layers and ii) disposed between the p-side waveguide layer and the barrier layer disposed closet to the p-side waveguide layer, the electron stopper layer selected to have a bandgap energy $E_g$ at least as large as the bandgap energy InP, with more than 50% of an energy offset associated with a discontinuity of the conduction band edge, and selected to provide a barrier for the flow of electrons from the active region to the p-side waveguide layer,
   *wherein the multilayer structure does not comprise a hole stopper layer that provides a potential barrier to the flow of holes from the active region to the n-side waveguide layer.*

*13. An article according to claim 1, wherein with said electron stopper layer is associated a potential barrier, said potential barrier being at least 50 meV.*

*14. An article according to claim 1, wherein the multilayer structure comprises at least one compositionally graded interface between two adjacent layers.*

*15. An article according to claim 1, wherein the at least one quantum well has a thickness selected to provide a single electron energy level and two or more hole energy levels in the quantum well, with the energy difference between said two hole energy levels being at least 2 kT, where k is Boltzmann's constant and T is a laser operating temperature in degrees Kelvin.*

*16. An article according to claim 1, wherein the electron stopper layer is selected to have a bandgap energy $E_g$ larger than the bandgap energy of InP.*

*17. An article according to claim 1, wherein said electron stopper layer has different discontinuities of the conduction band edge on either side of the electron stopper layer.*

*18. An article comprising a laser comprising a multilayer semiconductor structure on a substrate and contacts that facilitate flowing a current through the multilayer structure, the multilayer structure having a conduction band edge and comprising an n-side waveguide layer, an active region comprising i) at least one quantum well and ii) at least two barrier layers, each quantum well disposed between barrier layers, said active region containing all the quantum wells and all the barrier layers, and a p-side waveguide layer, with the active region disposed between said waveguide layers;
   CHARACTERIZED IN THAT
   the multilayer structure further comprises an electron stopper layer, said electron stopper layer being i) separate from all the barrier layers and ii) disposed between the p-side waveguide layer and the barrier layer disposed closest to the p-side waveguide layer, the electron stopper layer selected to have a bandgap energy $E_g$ at least as large as the bandgap energy InP, with more than 50% of an energy offset associated with a discontinuity of the conduction band edge, and selected to provide a barrier for the flow of electrons from the active region to the p-side waveguide layer,
   wherein said electron stopper layer has different discontinuities of the conduction band edge on either side of the electron stopper layer.*

*19. An article according to claim 18, wherein the electron stopper layer is selected to have a bandgap energy $E_g$ larger than the bandgap energy of InP.*

*20. An article according to claim 18, wherein with said electron stopper layer is associated a potential barrier, said potential barrier being at least 50 meV.*

*21. An article according to claim 18, wherein the multilayer structure comprises at least one compositionally graded interface between two adjacent layers.*

*22. An article according to claim 18, wherein the at least one quantum well has a thickness selected to provide a single electron energy level and two or more hole energy levels in the quantum well, with the energy difference between said two hole energy levels being at least 2 kT, where k is Boltzmann's constant and T is a laser operating temperature in degrees Kelvin.*

* * * * *